United States Patent  (10) Patent No.: US 8,502,319 B2
Takeda  (45) Date of Patent: Aug. 6, 2013

(54) SEMICONDUCTOR DEVICE AND PRODUCTION METHOD THEREOF

(75) Inventor: Hiroshi Takeda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 241 days.

(21) Appl. No.: 12/973,261

(22) Filed: Dec. 20, 2010

(65) Prior Publication Data

US 2011/0147815 A1   Jun. 23, 2011

(30) Foreign Application Priority Data

Dec. 21, 2009 (JP) ................................ 2009-289352

(51) Int. Cl.
*H01L 29/786* (2006.01)

(52) U.S. Cl.
USPC ............... 257/368; 257/E29.12; 257/E29.277

(58) Field of Classification Search
None
See application file for complete search history.

(56) References Cited

U.S. PATENT DOCUMENTS

| | | | | |
|---|---|---|---|---|
| 7,102,201 B2 * | 9/2006 | Furukawa et al. | ............ | 257/382 |
| 7,989,291 B2 * | 8/2011 | Clevenger et al. | ............ | 438/262 |
| 2006/0278909 A1 * | 12/2006 | Nishimuta et al. | ............ | 257/296 |
| 2007/0138570 A1 * | 6/2007 | Chong et al. | .................. | 257/371 |
| 2007/0145487 A1 * | 6/2007 | Kavalieros et al. | ............ | 257/368 |
| 2007/0287240 A1 * | 12/2007 | Chen et al. | ..................... | 438/197 |
| 2008/0038886 A1 * | 2/2008 | Pei | ................................. | 438/197 |
| 2008/0157224 A1 * | 7/2008 | Fischer et al. | ................. | 257/401 |
| 2008/0283906 A1 * | 11/2008 | Bohr | ............................. | 257/327 |
| 2009/0026504 A1 | 1/2009 | Okuda et al. | | |
| 2009/0321843 A1 * | 12/2009 | Waite et al. | .................... | 257/369 |
| 2011/0221003 A1 * | 9/2011 | Doris et al. | .................... | 257/368 |

FOREIGN PATENT DOCUMENTS

WO   WO2007/077748   7/2007

OTHER PUBLICATIONS

H.S. Yang et al., "Dual Stress Liner for High Performance sub-45nm Gate Length SOI CMOS Manufacturing", Dec. 13, 2004, 2004 International Electron Devices Meeting Technical Digest, The Institute of Electrical and Electronics Engineers, Inc., 1075-1078 (2004).

S. Yamakawa et al., "Study of Stress Effect on Replacement Gate Technology with Compressive Stress Liner and eSiGe for pFETs", Sep. 9, 2008, Proceedings of 2008 International Conference on Simulation of Semiconductor Processes and Devices, The Institute of Electrical and Electronics Engineers, Inc., 109-112 (2008).

* cited by examiner

*Primary Examiner* — Benjamin Sandvik

(74) *Attorney, Agent, or Firm* — Young & Thompson

(57) ABSTRACT

Disclosed is a semiconductor device wherein device characteristics are improved by applying a strong stress to a channel region. The semiconductor device includes a semiconductor substrate, a gate insulating film formed over a first plane of the semiconductor substrate, a gate electrode formed over the gate insulating film, a gate sidewall insulating film formed over the sidewall of the gate electrode, source/drain diffusion layer regions into which impurities are implanted, the source/drain diffusion layer regions being adjacent to a channel region formed in the semiconductor substrate below the gate electrode, and a stress applying film formed over the source/drain diffusion layer regions except over the upper part of the gate electrode; and recesses or protrusions are formed in the region where the source/drain diffusion layer regions are formed over the first plane of the semiconductor substrate.

6 Claims, 18 Drawing Sheets

SEMICONDUCTOR DEVICE AND PRODUCTION METHOD THEREOF

CROSS-REFERENCE TO RELATED APPLICATIONS

The disclosure of Japanese Patent Application No. 2009-289352 filed on Dec. 21, 2009 including the specification, drawings and abstract is incorporated herein by reference in its entirety.

BACKGROUND OF THE INVENTION

1. Field of the Invention

The present invention relates to a semiconductor device and a method for producing the semiconductor device.

2. Description of Related Art

In recent years, a strain channel technology for improving device performance by applying strain to a channel region is used for a miniaturized field effect transistor (FET).

It has heretofore been well known that performance is improved by applying a uniaxial tensile strain in a source/drain direction to a channel region in the case of an n-type FET and a uniaxial compressive strain in a source/drain direction to a channel region in the case of a p-type FET. On this occasion, it is expected that the application of a stronger strain yields better device performance.

As a method for introducing uniaxial strain in a source/drain direction, a method for forming a stress applying film so as to cover the upper plane of an FET is generally used and a structure of introducing different stress applying films to n-type and p-type FETs respectively is proposed (H. S. Yang et al., "Dual Stress Liner for High Performance sub-45 nm Gate Length SOI CMOS Manufacturing", 2004 International Electron Devices Meeting Technical Digest, The Institute of Electrical and Electronics Engineers, Inc., 1075-1078 (2004)).

Further, when a structure of protruding a source/drain region is used, proposed is a structure of bringing a stress applying film close to a channel region by etching a gate sidewall insulating film and forming a space between the source/drain region and a gate region in order to enhance strain generated in the channel region by the stress applying film (International Publication No. 2007/077748).

Furthermore, it is also reported that, in a metal-substituted gate process, stress applied to a channel is enhanced by removing a stress applying film formed over the upper parts of a dummy gate electrode and a gate electrode after the stress applying film is formed (S. Yamakawa et al., "Study of Stress Effect on Replacement Gate Technology with Compressive Stress Liner and eSiGe for pFETs", Proceedings of 2008 International Conference on Simulation of Semiconductor Processes and Devices, The Institute of Electrical and Electronics Engineers, Inc., 109-112 (2008)).

SUMMARY

Conventional methods have following problems.

It has been difficult to apply a strong strain to a channel region because the upper part of a gate electrode is covered with a stress applying film and strain is generated therefore in a direction opposite to an intended direction in the channel region. Meanwhile, a problem has been that a stress applying film is exfoliated from the surface of an FET and that causes strain in a channel region to weaken when a true stress caused by the stress applying film is large or when stress applied to the interface between the stress applying film and the surface of the FET is enhanced by using a structure of removing the stress applying film over the upper part of a gate electrode as described in S. Yamakawa et al., "Study of Stress Effect on Replacement Gate Technology with Compressive Stress Liner and eSiGe for pFETs", Proceedings of 2008 International Conference on Simulation of Semiconductor Processes and Devices, The Institute of Electrical and Electronics Engineers, Inc., 109-112 (2008).

In view of the above situation, an object of the present invention is to provide a semiconductor device wherein device characteristics are improved by applying a strong strain to a channel region.

According to an aspect of the present invention, a semiconductor device includes a semiconductor substrate, a gate insulating film formed over a first plane of the semiconductor substrate, a gate electrode formed over the gate insulating film, a gate sidewall insulating film formed over the sidewall of the gate electrode, a source/drain diffusion layer region, being adjacent to a channel region formed in the semiconductor substrate below the gate electrode, into which impurities are implanted, and a stress applying film formed over the source/drain diffusion layer region except over the upper part of the gate electrode; and a recess or a protrusion is formed in the region where the source/drain diffusion layer region is formed over the first plane of the semiconductor substrate.

According to another aspect of the present invention, a method for producing a semiconductor device includes the steps of forming a gate insulating film over a first plane of a semiconductor substrate and a gate electrode over the gate insulating film, forming a first layer over a first region that is a region in the semiconductor substrate adjacent to a region where the gate insulating film and the gate electrode are formed, at least a part of the plane of the first layer opposite to the plane touching the first region being not nearly parallel with the first plane of the semiconductor substrate, implanting impurities into the first layer and forming a source/drain diffusion layer region, and forming a stress applying film over the source/drain diffusion layer region except over the upper part of the gate electrode, and the first layer includes a material having a stronger adhesiveness with the semiconductor substrate than the stress applying film has.

In such a semiconductor device according to the present invention as described above, it is possible to increase a contact area between a source/drain diffusion layer region and a stress applying film formed over the source/drain diffusion layer region due to a protrusion or a recess formed in the source/drain diffusion layer region. Consequently, it is possible to inhibit the stress applying film from peeling off from the surface of the source/drain diffusion layer region.

Further, in a semiconductor device according to the present invention, a stress applying film is hooked on a protrusion or a recess formed in a source/drain diffusion layer region when the stress applying film contracts or expands. Consequently, it is possible to apply stress to the source/drain diffusion layer region from the side plane of the protrusion or the recess directly and mechanically.

Furthermore, in a semiconductor device according to the present invention, the upper part of a gate electrode is not covered with a stress applying film. Consequently, it can be avoided that a strain is generated in a direction opposite to an intended direction in a channel region and that makes it difficult to apply a strong strain to the channel region.

That is, a semiconductor device according to the present invention makes it possible to apply a strong uniaxial strain to a channel region of the semiconductor device and improve device characteristics.

The present invention makes it possible to apply a strong strain to a channel region.

DETAILED DESCRIPTION OF THE PREFERRED EMBODIMENTS

Exemplary Embodiments according to the present invention are explained hereinafter in reference to drawings. In all the drawings, similar constituent components are represented with the same reference symbols respectively and explanations are omitted appropriately.

First Exemplary Embodiment

Figure 1A:
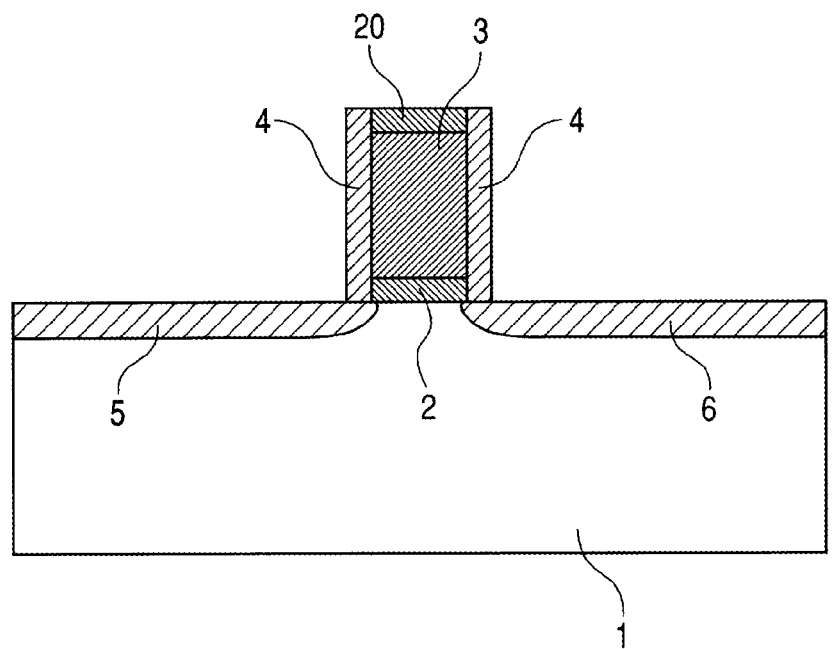
FIG. 1A is a sectional view (1) showing an example of an FET according to a first exemplary embodiment of a semiconductor device of the present invention.
Figure 1B:
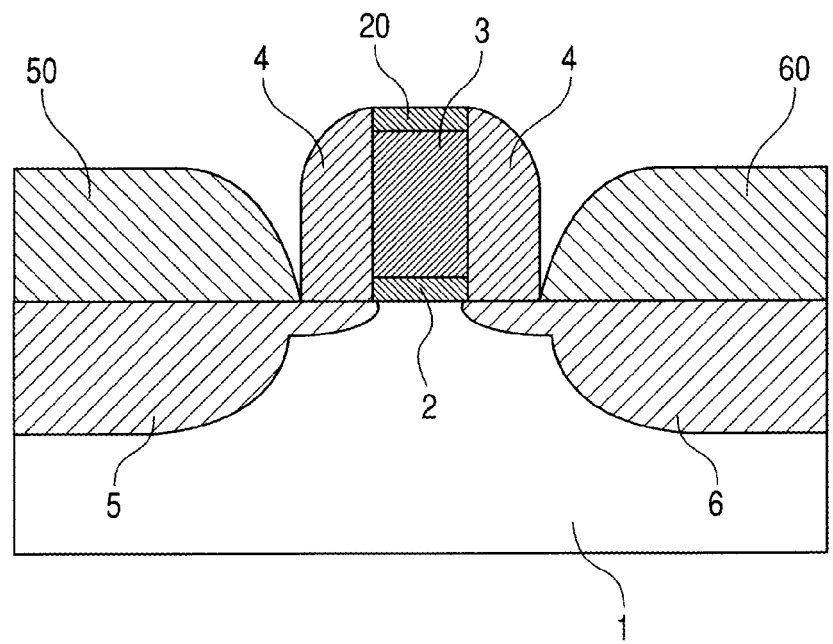
FIG. 1B is a sectional view (2) showing an example of an FET according to the first exemplary embodiment of a semiconductor device of the present invention.
Figure 1C:
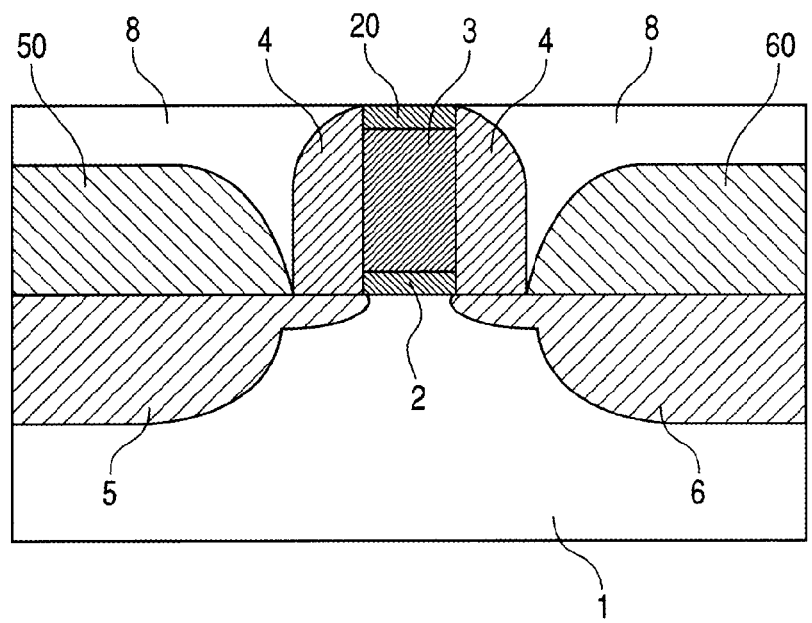
FIG. 1C is a sectional view (3) showing an example of an FET according to the first exemplary embodiment of a semiconductor device of the present invention.
Figure 1D:
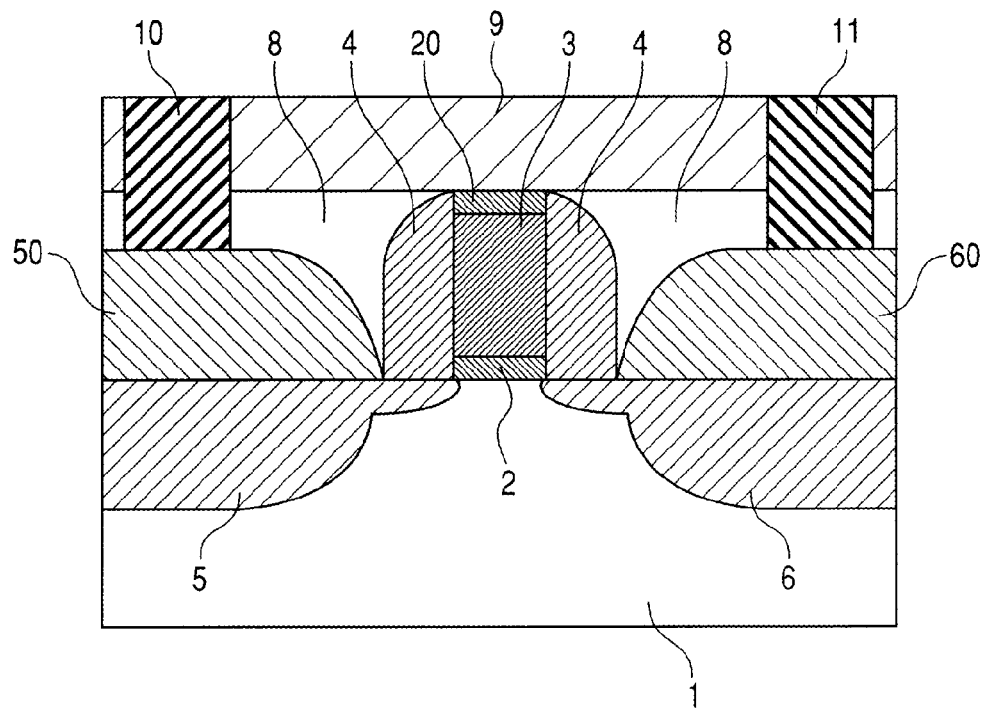
FIG. 1D is a sectional view (4) showing an example of an FET according to the first exemplary embodiment of a semiconductor device of the present invention.

A sectional view of an example of a semiconductor device according to a first exemplary embodiment of the present invention is shown in FIG. 1D.

As shown in the figure, a semiconductor device according to the present embodiment includes: a semiconductor substrate 1; a gate insulating film 2 formed over a first plane (a plane on the upside in the figure) of the semiconductor substrate 1; a gate electrode 3 formed over the gate insulating film 2; a gate sidewall insulating film 4 formed over the sidewall of the gate electrode 3; a source/drain diffusion layer region 5, 6, being adjacent to a channel region formed in the semiconductor substrate 1 below the gate electrode 3, into which impurities are implanted; protrusions 50 and 60 or recesses (not shown in the figure) formed in a region where the source/drain diffusion layer region 5, 6 is formed over the first plane (the plane on the upside in the figure) of the semiconductor substrate 1; and a stress applying film 8 formed over the source/drain diffusion layer region 5, 6 (over the protrusions 50 and 60 of the source/drain diffusion layer region 5, 6 in the case of the figure) except over the upper part of the gate electrode 3. Further, the semiconductor device may have a gate protective film 20 over the gate electrode 3. The stress applying film 8 comprises a compressive material or an expansive material.

The protrusions 50 and 60 or the recesses (not shown in the figure) may be configured so that at least a part of the plane thereof touching the stress applying film 8 may not be nearly parallel with the first plane (the plane on the upside in the figure) of the semiconductor substrate 1. For example, the protrusions 50 and 60 or the recesses (not shown in the figure) may be configured so that the angle formed between at least a part of the plane thereof touching the stress applying film 8 and the first plane (the plane on the upside in the figure) of the semiconductor substrate 1 may be not less than 30 degrees. Otherwise, the protrusions 50 and 60 or the recesses (not shown in the figure) may be configured so that the angle formed between at least a part of the plane thereof touching the stress applying film 8 and the first plane (the plane on the upside in the figure) of the semiconductor substrate 1 may be nearly 90 degrees.

The protrusions 50 and 60 may be formed by protruding the source/drain diffusion layer region 5, 6 from the first plane (the plane on the upside in the figure) of the semiconductor substrate 1 as shown in FIG. 1D. Further, interstices (nearly V-shaped interstices in the figure) may be formed between the protrusions 50 and 60 and the gate sidewall insulating film 4 and the stress applying film 8 may be formed in the interstices. Heights of the protrusions 50 and 60 from the first plane (the plane on the upside in the figure) of the semiconductor substrate 1 can be in a range of about 10 nm to 50 nm. The heights stated above are only examples and a semiconductor device according to the present embodiment is not limited to the case.

Furthermore, the protrusions or the recesses of the source/drain diffusion layer region 5, 6 according to the present embodiment may have following configurations other than the protrusions 50 and 60 shown in the figure. For example, protrusions or recesses may be formed by partially digging down a source/drain diffusion layer region 5, 6 formed in a semiconductor substrate 1. Otherwise, protrusions or recesses may be formed by: protruding a source/drain diffusion layer region 5, 6 formed in a semiconductor substrate 1 from the first plane (the plane on the upside in the figure) of the semiconductor substrate 1 so as not to form interstices between the source/drain diffusion layer region 5, 6 and a gate sidewall insulating film 4; and partially digging down the protruded source/drain diffusion layer region 5, 6. The protrusions or the recesses in the latter case may be protrusions 51 and 61 and recesses that will be explained in the second exemplary embodiment below.

In a semiconductor device according to the present embodiment, at least a part of the plane of a source/drain diffusion layer region 5, 6 touching a stress applying film 8 is not nearly parallel with a first plane (a plane on the upside of the figure) of a semiconductor substrate 1 due to protrusions or recesses (for example, protrusions 50 and 60 in FIG. 1D) of the source/drain diffusion layer region 5, 6.

In such a semiconductor device according to the present embodiment as described above, since a source/drain diffusion layer region 5, 6 has protrusions or recesses (for example, protrusions 50 and 60 in FIG. 1D), it is possible to increase the contact area between a stress applying film 8 and the source/drain diffusion layer region 5, 6. Consequently, it is possible to inhibit the stress applying film 8 from peeling off from the surface of the source/drain diffusion layer regions 5, 6.

Further, in a semiconductor device according to the present embodiment, a stress applying film 8 is hooked on protrusions or recesses (for example, protrusions 50 and 60 in FIG. 1D) when the stress applying film 8 contracts or expands. Consequently, it is possible to apply stress to a source/drain diffusion layer region 5, 6 from the side planes of the protrusions or the recesses (for example, the protrusions 50 and 60 in FIG. 1D) directly and mechanically.

Here, when the angle formed between at least a part of the plane of protrusions or recesses (for example, protrusions 50 and 60 in FIG. 1D) touching a stress applying film 8 and the first plane (the plane on the upside in the figure) of a semiconductor substrate 1 is not less than 30 degrees, the stress applying film 8 is further likely to be hooked on the protrusions or the recesses (for example, the protrusions 50 and 60 in FIG. 1D). Moreover, when protrusions (for example, protrusions 50 and 60 in FIG. 1D) are configured so that the heights thereof from the first plane (the plane on the upside in the figure) of a semiconductor substrate 1 may be 10 nm or more, a stress applying film 8 is further likely to be hooked on the protrusions or the recesses (for example, the protrusions 50 and 60 in FIG. 1D).

Furthermore, in a semiconductor device according to the present embodiment, the upper part of a gate electrode 3 is not covered with a stress applying film 8. Consequently, it can be avoided that a strain is generated in a direction opposite to an intended direction in a channel region and that makes it difficult to apply a strong strain to the channel region.

That is, a semiconductor device according to the present embodiment makes it possible to apply a strong uniaxial strain to a channel region of the semiconductor device and improve device characteristics.

A method for producing a semiconductor device according to the present embodiment is explained hereunder.

A method for producing a semiconductor device according to the present embodiment includes the processes of forming a gate insulating film 2 over a first plane (a plane on the upside in the figure) of a semiconductor substrate 1 and a gate electrode 3 over the gate insulating film 2 as shown in FIG. 1A for example, forming a first layer (protrusions 50 and 60) over a first region (a source/drain diffusion layer region 5 and 6) that is a region in the semiconductor substrate 1 adjacent to a region where the gate insulating film 2 and the gate electrode 3 are formed, at least a part of the plane of the first layer opposite to the plane touching the first region (the source/drain diffusion layer region 5, 6) being not nearly parallel with the first plane (the plane on the upside in the figure) of the semiconductor substrate 1, as shown in FIG. 1B for example, implanting impurities into the first layer (the protrusions 50 and 60) and forming a source/drain diffusion layer region, and forming a stress applying film 8 over the source/drain diffusion layer region (the impurity-implanted protrusions 50 and 60) except over the upper part of the gate electrode 3 as shown in FIG. 1C for example; and the first layer (the protrusions 50 and 60) comprises a material having a stronger adhesiveness with the semiconductor substrate 1 than the stress applying film 8 has.

Further, in a method for producing a semiconductor device according to the present embodiment: the first plane (the plane on the upside in the figure) of the semiconductor substrate 1 (refer to FIG. 1B) may comprise a first semiconductor (Si for example); and the process of forming the first layer (the protrusion 50 and 60) may be a process of forming the first layer (the protrusion 50 and 60) by growing the first semiconductor (Si for example) by a CVD method.

Further, in a method for producing a semiconductor device according to the present embodiment: the first plane (the plane on the upside in the figure) of the semiconductor substrate 1 may comprise a first semiconductor (Si for example); and the process of forming the first layer (the protrusion 50 and 60) may include the processes of selectively digging down the first region (the region to be the source/drain diffusion layer region 5, 6, refer to FIG. 1B) in the state shown in FIG. 1A by photolithography and etching and forming the first layer (the protrusion 50 and 60) filling also the dug down region by growing the first semiconductor (Si for example) or a semiconductor (SiGe for example) other than the first semiconductor (Si for example) by a CVD method.

Further, in a method for producing a semiconductor device according to the present embodiment: the semiconductor substrate 1 may include a first semiconductor layer, an insulating film layer formed over the surface of the first semiconductor layer, and a second semiconductor layer formed over the surface of the insulating film layer; and the plane opposite to the plane of the second semiconductor layer touching the insulating film layer constitutes the first plane of the semiconductor substrate.

An example of a method for producing a semiconductor device according to the present embodiment is hereunder explained in detail in reference to FIGS. 1A to 1D. FIGS. 1A to 1D are sectional views showing an example of the structure of a semiconductor device according to the present embodiment in the sequence of the processes.

Firstly, an ordinary MOS-type FET structure shown in FIG. 1A is formed by a known method. For example, a Si substrate is used as a semiconductor substrate 1 and a gate insulating film 2 is formed over a first plane (the plane on the upside in the figure) of the semiconductor substrate 1. Then, poly-Si for example is deposited as a gate electrode material over the gate insulating film 2 and a gate electrode 3 is formed by photolithography and etching. Thereafter, a gate protective film 20 and a gate sidewall insulating film 4 are formed. The gate protective film 20 and the gate sidewall insulating film 4 may also be formed for example by depositing an insulating film comprising silicon oxide or silicon nitride with a CVD (Chemical Vapor Deposition) apparatus or a sputtering apparatus and thereafter removing the insulating film except the insulating film over the gate sidewall with a reactive ion etching apparatus. Thereafter, ions are implanted into a source and drain regions and an extension diffusion layer is formed. In the ion implantation, As or P is used in the case of an n-type and B or In is used in the case of a p-type, and a typical dose amount may be about $1 \times 10^{14}$ pieces per 1 $cm^2$. If an extension diffusion layer is not required, it is not necessary to apply ion implantation.

Here, although the Si substrate is used as the semiconductor substrate 1 in the above case, the present embodiment is not limited to the case and a SiGe substrate, a Ge substrate, a strained Si substrate, or a strained SiGe substrate can be used as the semiconductor substrate 1. Further, the semiconductor substrate 1 according to the present embodiment can be a so-called SOI (Silicon On Insulator) substrate that: includes a first semiconductor layer, an insulating film layer formed over the surface of the first semiconductor layer, and a second semiconductor layer formed over the surface of the insulating film layer; and is configured so that the plane opposite to the plane of the second semiconductor layer touching the insulating film layer may be the first plane of the semiconductor substrate.

After the structure shown in FIG. 1A is obtained, the thickness of the gate sidewall insulating film 4 is increased as shown in FIG. 1B for example by using a method similar to the method used when the gate sidewall insulating film 4 shown in FIG. 1A has been formed. On this occasion, the gate sidewall insulating film 4 may take a laminated structure of silicon oxide or silicon nitride. Successively, ions are implanted into the source and drain regions and thus a source diffusion layer region 5 and a drain diffusion layer region 6 are formed. In the ion implantation, As or P is used in the case of an n-type and B or In is used in the case of a p-type, and a typical dose amount may be about $1 \times 10^{15}$ pieces per 1 $cm^2$.

Successively, protrusions 50 and 60 are formed over the source/drain diffusion layer region 5, 6 with a CVD apparatus for example in the state where the gate sidewall insulating film 4 and the gate protective film 20 are masked with a photoresist or the like. The protrusions 50 and 60 can be formed by using the same material as the material used for the substrate or the layer forming the source/drain diffusion layer region 5, 6. That is, in the case where the source/drain diffusion layer region 5, 6 is formed in a Si substrate or a Si layer, the protrusions 50 and 60 can be formed by using Si. Meanwhile, in the case where the source/drain diffusion layer region 5, 6 is formed in a SiGe substrate or a SiGe layer, the protrusions 50 and 60 can be formed by using SiGe.

When the protrusions 50 and 60 are formed in this way, since a crystal tends to grow in a region having an identical crystal structure, the protrusions 50 and 60 gradually uprising from the vicinity of the boundary between the region where the gate sidewall insulating film 4 is formed and the region where the source/drain diffusion layer region 5, 6 is formed are formed as shown in FIG. 1B. That is, interstices are formed between the protrusion 50 and the gate sidewall insulating film 4 and between the protrusion 60 and the gate sidewall insulating film 4.

Further, the protrusions 50 and 60 formed by selecting such a material as described above have a stronger adhesiveness with the semiconductor substrate 1 forming the source/drain diffusion layer region 5, 6 than the stress applying film 8 formed over the protrusions 50 and 60 has.

Meanwhile, it is also possible to form protrusions 50 and 60 through the following processes. Firstly, before protrusions 50 and 60 are formed, a region to be a source/drain diffusion layer region 5, 6 of a semiconductor substrate 1 in the state shown in FIG. 1A (refer to FIG. 1B) is selectively dug down by photolithography and etching. Thereafter, the region dug down through the above process is filled with a CVD apparatus for example in the state where a gate sidewall insulating film 4 and a gate protective film 20 are masked with a photoresist and the protrusions 50 and 60 protruding from a first plane of the semiconductor substrate 1 are formed. The protrusions 50 and 60 in the case can be formed by using not only a material identical to the semiconductor substrate 1 forming the source/drain diffusion layer region 5, 6 but also a different material, namely a material having a different lattice constant. For example, when a source/drain diffusion layer region 5, 6 is formed in a Si substrate or a Si layer, protrusions 50 and 60 may be formed by using SiGe or SiC. Even when protrusions 50 and 60 are formed in this way, the protrusions 50 and 60 having the shape shown in FIG. 1B are formed. That is, interstices are formed between a protrusion 50 and a gate sidewall insulating film 4 and between a protrusion 60 and the gate sidewall insulating film 4. Further, since the contact area between protrusions 50 and 60 and a semiconductor substrate 1 can be increased, it is possible to enhance adhesiveness between the protrusions 50 and 60 and the semiconductor substrate 1 and resultantly expand the design range of a material for the protrusions 50 and 60.

Here, when a crystal grows with a CVD apparatus, it is also possible to mix a gas containing P or B and introduce impurities into a source/drain diffusion layer region 5, 6 and protrusions 50 and 60.

Successively, ions are implanted into the protrusions 50 and 60 of the structure shown in FIG. 1B. In the ion implantation, As or P is used in the case of an n-type and B or In is used in the case of a p-type, and a typical dose amount is about $1 \times 10^{15}$ pieces per 1 $cm^2$. After the implantation, the implanted ion species are activated by applying annealing at about 1,000° C. Through the process, the protrusions 50 and 60 come to be a part of the diffusion layer of a source region and a drain region.

Successively as shown in FIG. 1C, a stress applying film 8 is formed over the protrusions 50 and 60 that have come to be the diffusion layer of the source region and the drain region except over the upper part of the gate electrode 3. For example, a stress applying film 8 can be formed by removing silicon nitride over the gate protective film 20 by CMP (Chemical Mechanical Polishing) after a silicon nitride film is formed with a CVD apparatus. The silicon nitride film can be formed by using $SiH_2Cl_2$ and $NH_3$ for example and a thermal expansion coefficient can be controlled by changing a mixing ratio on that occasion and a pressure at film forming. A stress applying film 8 that has a higher thermal expansion coefficient than Si of the substrate has and contracts more than Si of the substrate during cooling after the film forming is desirable in the case of an n-type FET. In contrast, a stress applying film 8 that contracts less than Si is desirable in the case of a p-type FET.

Thereafter, a Si oxide film for example is formed as an interlayer insulating film 9 over the stress applying film 8 and the gate protective film 20 and contact holes of source and drain electrodes passing through the interlayer insulating film 9 and the stress applying film 8 are pierced by photolithography and etching. Then a source electrode 10 and a drain electrode 11 are formed by embedding Al or Cu as the electrode material into the holes and the structure shown in FIG. 1D is completed.

Here, explanation on a method for forming protrusions having a configuration different from the protrusions 50 and 60 shown in FIG. 1D is omitted since it can be realized by using conventional photolithography and etching.

Second Exemplary Embodiment

The present embodiment is based on the first exemplary embodiment but the configuration of protrusions 50 and 60 is partially different from the first exemplary embodiment. The difference is explained hereunder.

Figure 2A:
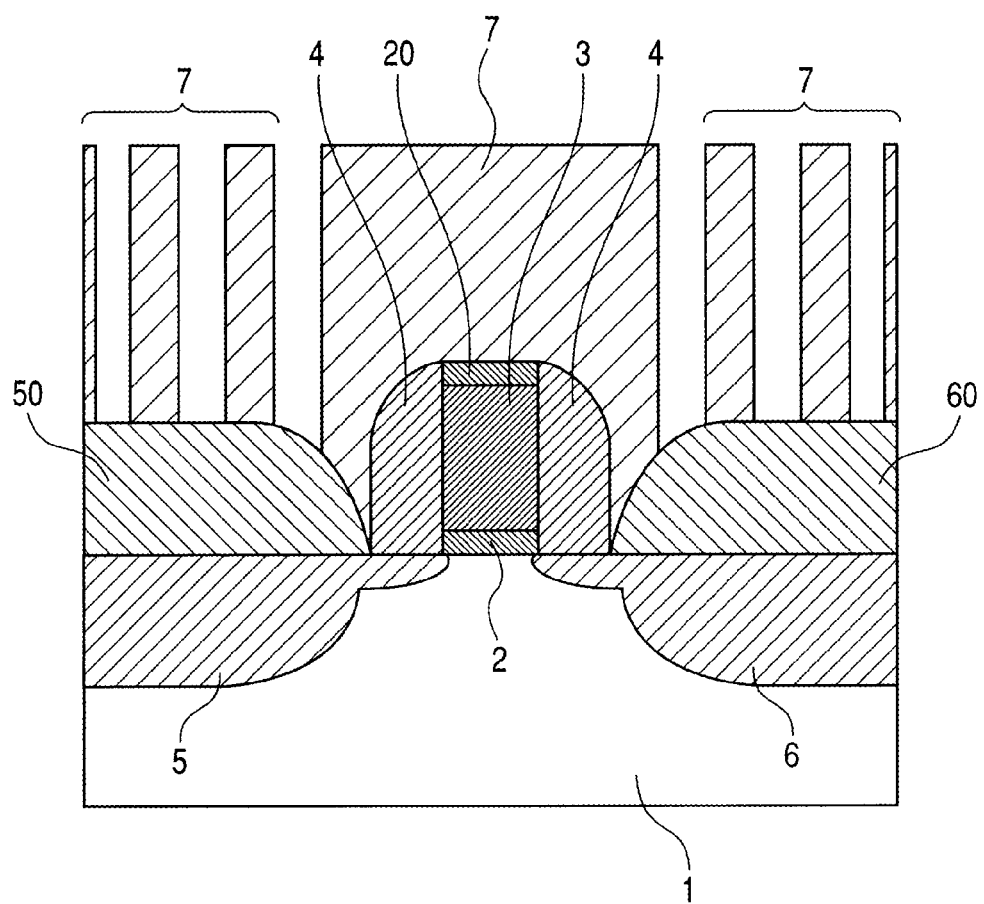
FIG. 2A is a sectional view (1) showing an example of an FET according to a second exemplary embodiment of a semiconductor device of the present invention.
Figure 2B:
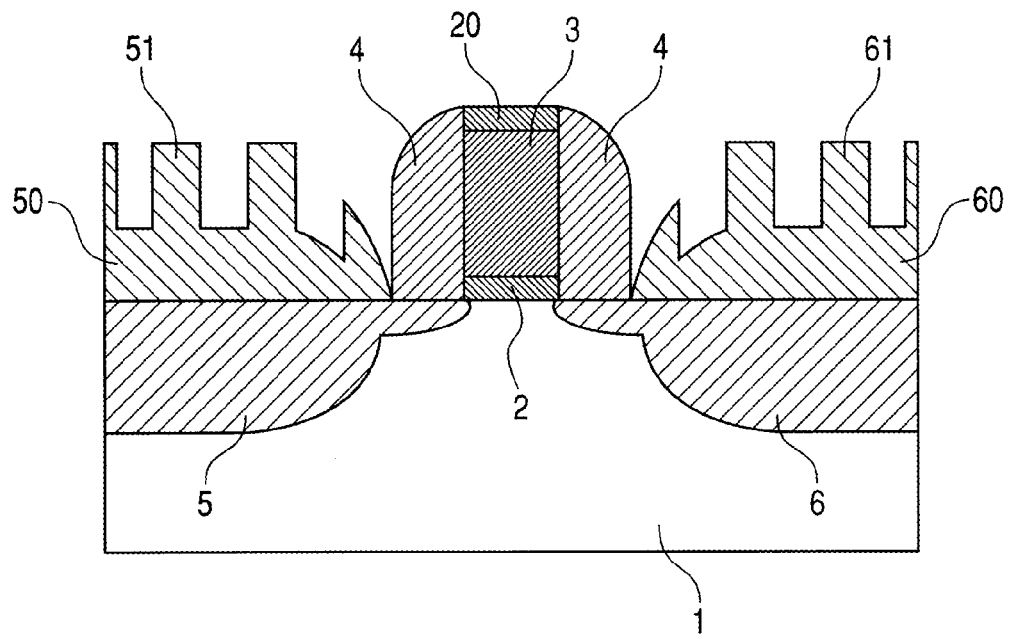
FIG. 2B is a sectional view (2) showing an example of an FET according to the second exemplary embodiment of a semiconductor device of the present invention.
Figure 2C:
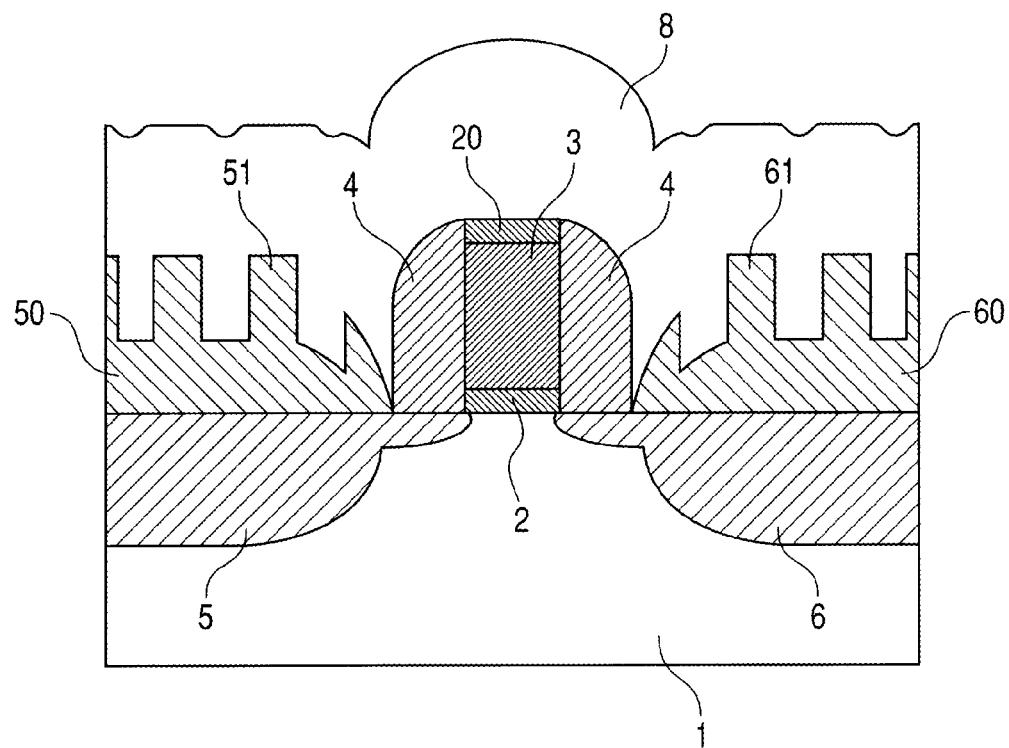
FIG. 2C is a sectional view (3) showing an example of an FET according to the second exemplary embodiment of a semiconductor device of the present invention.
Figure 2D:
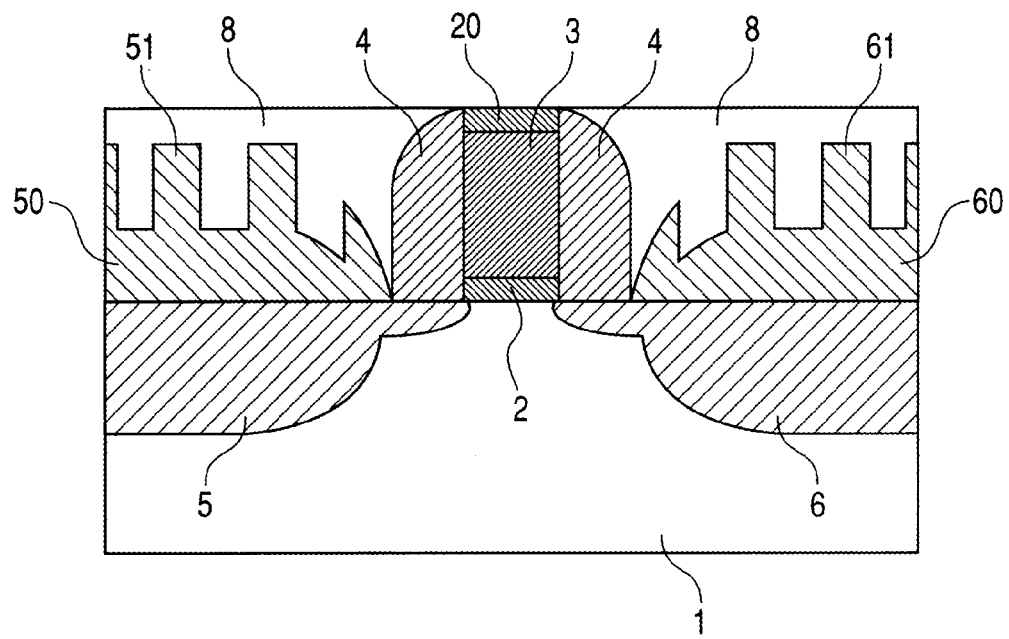
FIG. 2D is a sectional view (4) showing an example of an FET according to the second exemplary embodiment of a semiconductor device of the present invention.
Figure 2E:
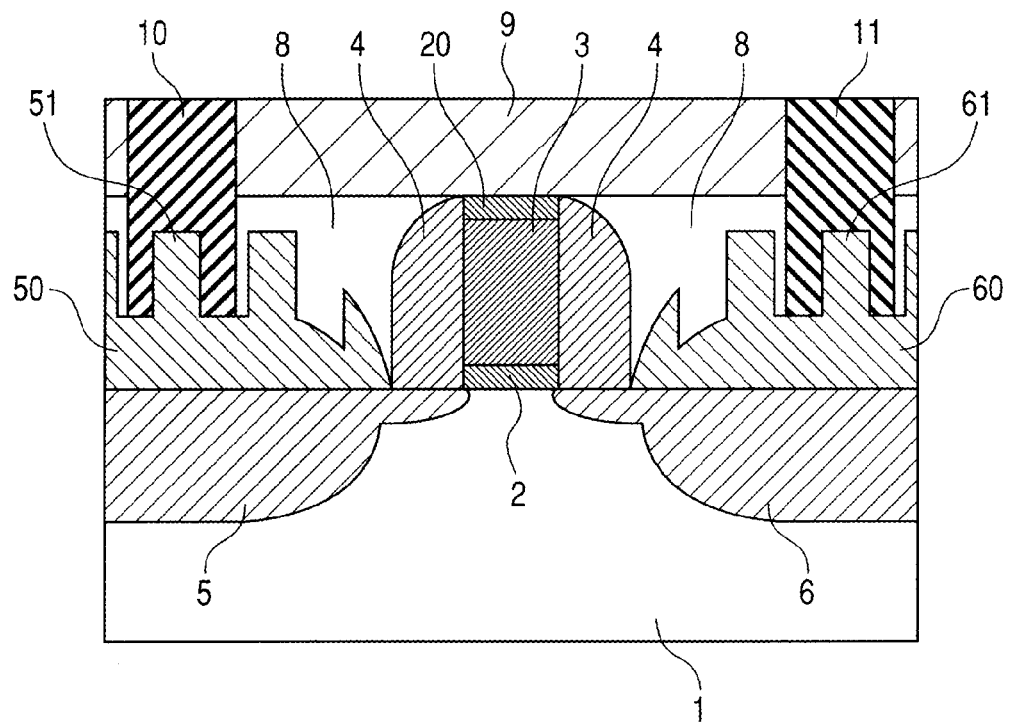
FIG. 2E is a sectional view (5) showing an example of an FET according to the second exemplary embodiment of a semiconductor device of the present invention.
Figure 3:
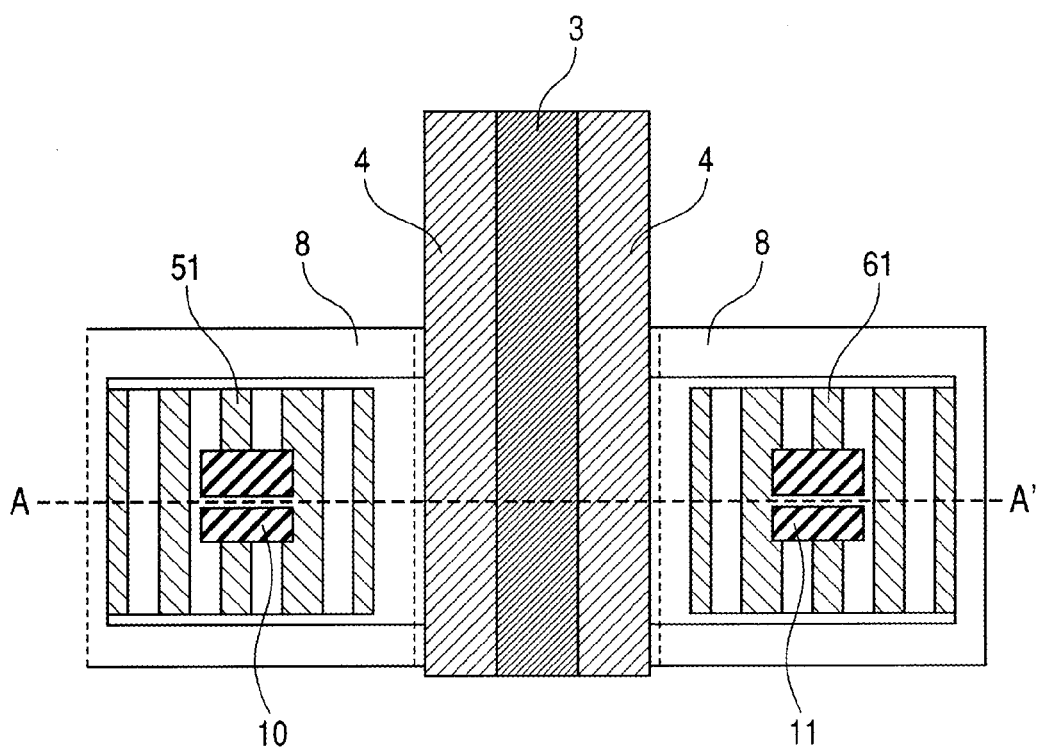
FIG. 3 is a top view showing a structure of the FET shown in FIG. 2E from which a gate protective film and an interlayer insulating film are removed.

A sectional view of an example of a semiconductor device according to the present embodiment is shown in FIG. 2E. Further, a top view of a structure after a gate protective film 20 and an interlayer insulating film 9 are removed in the semiconductor device shown in FIG. 2E is shown in FIG. 3. Here, FIG. 2E is a view configured by adding a gate protective film 20 and an interlayer insulating film 9 to a sectional view taken on line A-A' of FIG. 3.

As shown in FIG. 2E, in a semiconductor device according to the present embodiment, protrusions 51 and 61 and recesses are further formed over the planes of protrusions 50 and 60 touching a stress applying film 8.

At least parts of the protrusions 51 and 61 or the recesses may extend in a direction intersecting with a first straight line intersecting nearly perpendicularly with the direction where a gate electrode 3 extends (refer to FIG. 3). For example, at least parts of the protrusions 51 and 61 or the recesses may extend in a direction intersecting nearly perpendicularly with the aforementioned first straight line. Then it is also possible to install plural pieces of the protrusions 51 and 61 or the recesses and align at least parts of the protrusions 51 and 61 or the recesses nearly parallel with each other.

FIGS. 2E and 3 show, as an example of the present embodiment, the case where the protrusions 51 and 61 extend nearly perpendicularly to the first straight line intersecting nearly perpendicularly with the direction where the gate electrode 3 extends (refer to FIG. 3) and plural pieces of the protrusions 51 and 61 or the recesses are aligned nearly parallel with each other.

Here, as it has been explained in the first exemplary embodiment, a semiconductor device according to the present embodiment may take a configuration wherein protrusions 51 and 61 and recesses are formed by: protruding a source/drain diffusion layer region 5, 6 formed in a semiconductor substrate 1 from the first plane (the plane on the upside in the figure) of the semiconductor substrate 1 so that interstices may not be formed between the source/drain diffusion layer region 5, 6 and a gate sidewall insulating film 4; and partially digging down the protruded source/drain diffusion layer region 5, 6. That is, although interstices are formed between the protrusions 50 and 60 and the gate sidewall insulating film 4 and a stress applying film 8 is formed in the interstices in the case of FIG. 2E, such interstices may not be formed.

Further, the aforementioned protrusions 51 and 61 may take another structure such as a groove structure over a lattice or a structure having plural isolated holes.

With a semiconductor device according to the present embodiment having protrusions 51 and 61 in addition to the protrusions 50 and 60 like the example shown in FIGS. 2E and 3, it is possible to increase the contact area between a stress applying film 8 and a source/drain diffusion layer region 5, 6 further than the first exemplary embodiment. As a result, it is possible to inhibit the stress applying film 8 from peeling off from the surface of the source/drain diffusion layer region 5, 6.

Further, in the case where the protrusions 51 and 61 and recesses are configured so as to extend in a direction intersecting (a direction perpendicularly intersecting) with a first straight line intersecting nearly perpendicularly with the direction where the gate electrode 3 extends (refer to FIG. 3), a stress applying film 8 is more likely to be hooked on the protrusions 51 and 61 or the recesses than in the case of the first exemplary embodiment when the stress applying film 8 contracts or expands. As a result, stress is more likely to be applied to a source/drain diffusion layer region 5, 6 from the side planes of the protrusions 51 and 61 or the recesses directly and mechanically.

Further, in the case where a plurality of extending protrusions 51 and 61 and recesses are aligned nearly parallel with each other, the directions of stresses applied to the protrusions 51 and the recesses are likely to be uniform when the stress applying film 8 contracts or expands.

That is, a semiconductor device according to the present embodiment makes it possible to apply a strong uniaxial strain to a channel region of the semiconductor device and improve device characteristics.

Further, in addition to the above effects, a semiconductor device according to the present embodiment: makes it possible to increase the contact area between a source electrode 10 and a drain electrode 11 and a source/drain diffusion layer region (protrusions 50 and 60 having protrusions 51 and 61) (refer to FIG. 2E); and hence exhibits a secondary effect of reducing contact resistance.

Here, a semiconductor device according to the present embodiment: desirably has a configuration shown in FIGS. 2E and 3; but is not limited to the configuration as stated above.

Figure 4:
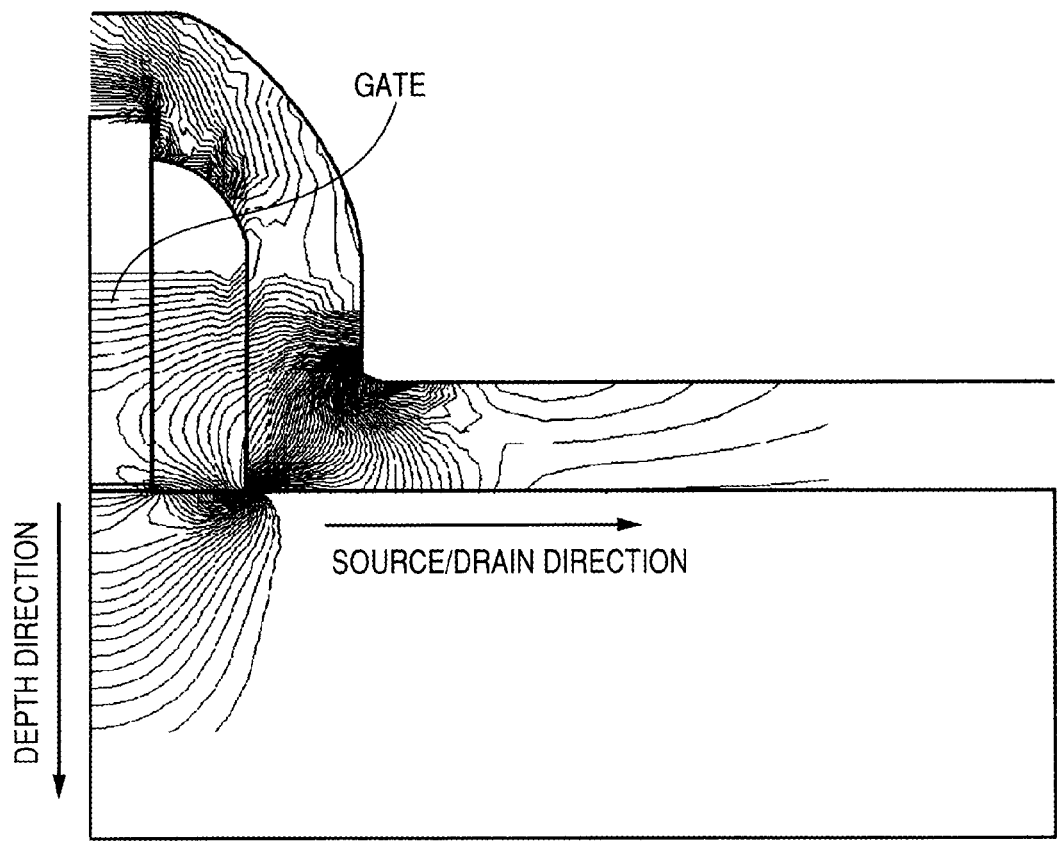
FIG. 4 is a view showing contour curves representing a stress distribution computed by simulation in a conventional structure.
Figure 5:
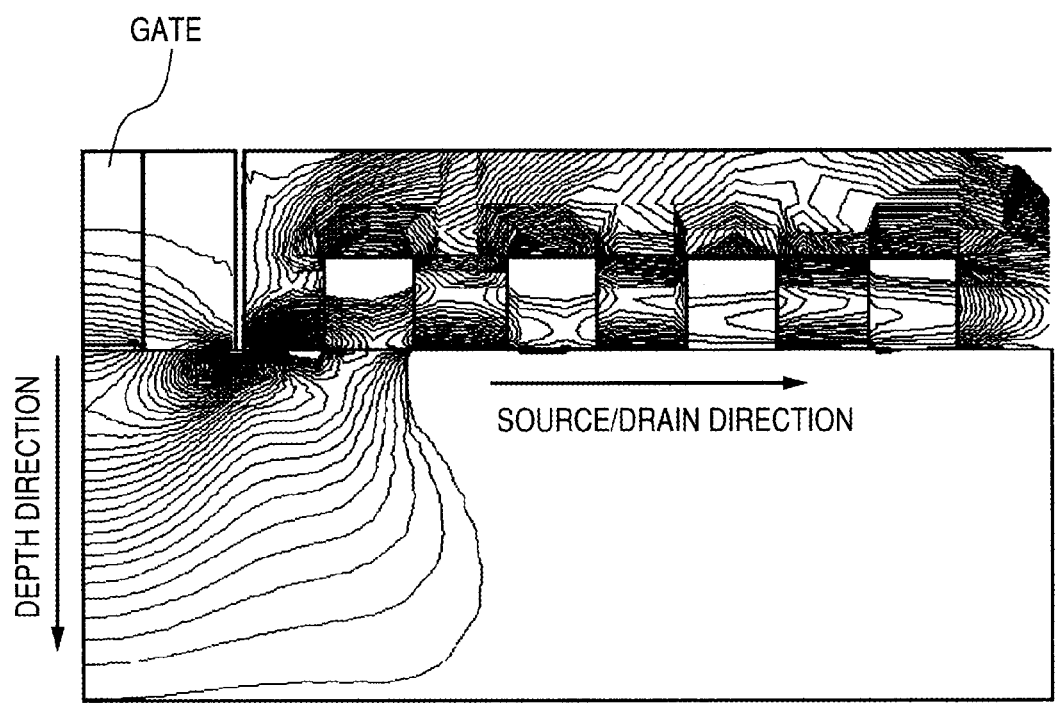
FIG. 5 is a view showing contour curves representing a stress distribution computed by simulation in the second exemplary embodiment of the present invention.

Here, FIGS. 4 and 5 are views showing the contour curves representing source/drain direction stress σxx distribution computed by simulation in a conventional structure and a structure according to the present embodiment, respectively. Simulation is carried out by envisaging an n-type FET and using a compressive silicon nitride film having a true stress of 1.3 GPa as a stress applying film so that a uniaxial tensile stress may be applied to a channel region. The gate length is 65 nm.

Figure 6:
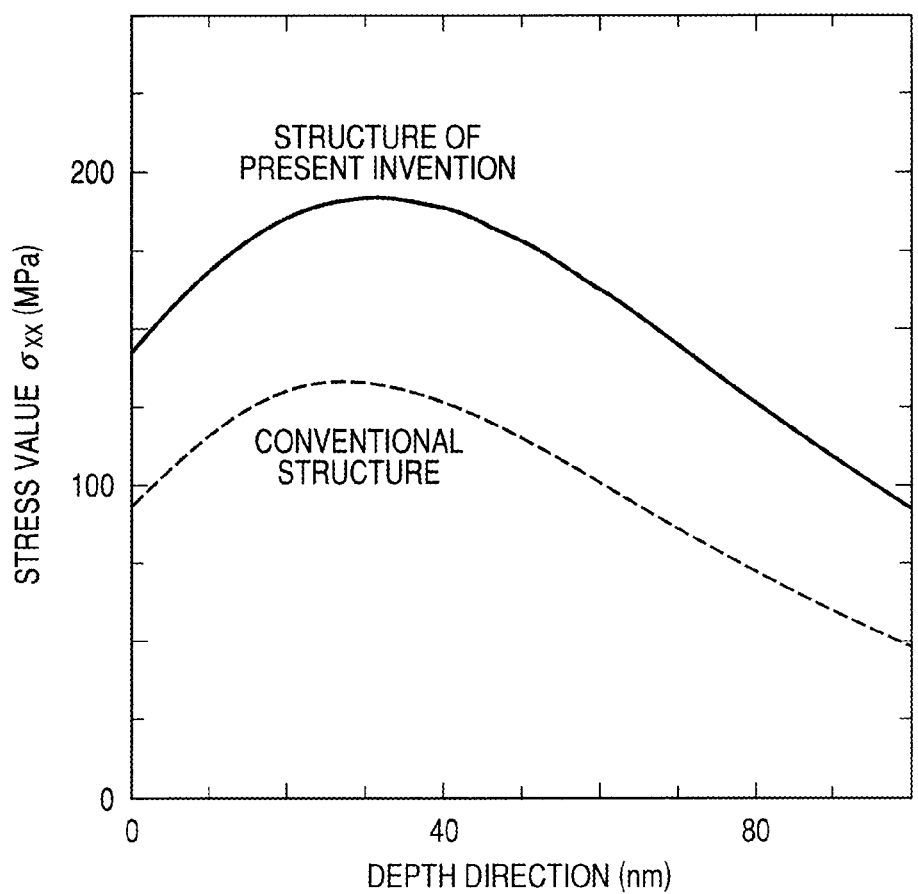
FIG. 6 is a view showing a distribution of source/drain direction stress σxx in a depth direction.

A view showing the distribution of the stress in the depth direction at the center portion of each of the channels shown in FIGS. 4 and 5 is FIG. 6 and it is understood that the source/drain direction stress σxx is enhanced by using the structure according to the present embodiment. In this way, since σxx in a channel region can be increased by using a structure according to the present embodiment, the characteristics of a FET can be improved.

A method for producing such a semiconductor device according to the present embodiment as described above is explained hereunder.

A method for producing a semiconductor device according to the present embodiment is based on a method for producing a semiconductor device according to the first exemplary embodiment and, as shown in FIG. 2B, a process of forming a first layer over a first region (a source/drain diffusion layer region 5, 6) that is a region in a semiconductor substrate adjacent to a region where a gate insulating film 2 and a gate electrode 3 are formed, at least a part of the plane of the first layer opposite to the plane touching the first region (the source/drain diffusion layer region 5, 6) being not nearly parallel with the first plane (the plane on the upside in the figure) of the semiconductor substrate 1, further includes a process of forming protrusions and recesses (for example, protrusions 51 and 61 in FIG. 2B) in a layer (for example, 50 and 60 in FIG. 2A) by photolithography and etching after the layer (for example, 50 and 60 in FIG. 2A) is formed by growing a first semiconductor or a semiconductor other than the first semiconductor.

An example of a method for producing a semiconductor device according to the present embodiment is hereunder explained in detail in reference to FIGS. 2A to 2E. FIGS. 2A to 2E represent sectional views showing an example of the structure of a semiconductor device according to the present embodiment in the sequence of the processes after the processes of forming the structure shown in FIG. 1B. Here, the processes employed until the structure shown in FIG. 1B is obtained are the same as those employed in the first exemplary embodiment and hence the explanations thereof are omitted here.

After the structure shown in FIG. 1B is obtained, as shown in FIG. 2A, an intended pattern of a photoresist 7 is formed by applying, exposing, and developing the photoresist over the protrusions 50 and 60, the gate protective film 20, and the gate sidewall insulating film 4. Then a structure wherein intended protrusions 51 and 61 are formed over the surface of the protrusions 50 and 60 as shown in FIG. 2B is obtained by peeling off the photoresist 7 with an ashing device for example after the protrusions 50 and 60 are etched by reactive ion etching.

Thereafter, in the structure shown in FIG. 2B, ions are implanted into the protrusions 50 and 60 having the protrusions 51 and 61. In the ion implantation, As or P is used in the case of an n-type and B or In is used in the case of a p-type, and a typical dose amount is about $1 \times 10^{15}$ pieces per 1 cm$^2$. After the implantation, the implanted ion species are activated by applying annealing at about 1,000° C. Through the process, the protrusions 50 and 60 having the protrusions 51 and 61 come to be a part of the diffusion layer of a source region and a drain region.

Successively, as shown in FIG. 2C, a stress applying film 8 is formed over the protrusions 50 and 60 having the protrusions 51 and 61. The stress applying film 8 is formed typically with silicon nitride by using a CVD apparatus. A silicon nitride film can be formed by using $SiH_2Cl_2$ and $NH_3$ for example and a thermal expansion coefficient can be controlled by changing a mixing ratio on that occasion and a pressure at film forming. A stress applying film 8 that has a higher thermal expansion coefficient than Si of the substrate has and contracts more than Si of the substrate during cooling after the film forming is desirable in the case of an n-type FET. In contrast, a stress applying film 8 that contracts less than Si is desirable in the case of a p-type FET. Thereafter, as shown in FIG. 2D, the stress applying film 8 over the gate protective film 20 is removed by CMP (Chemical Mechanical Polishing).

Thereafter, a silicon oxide film for example is formed as an interlayer insulating film 9 over the stress applying film 8 and the gate protective film 20 and contact holes of source and drain electrodes passing through the interlayer insulating film 9 and the stress applying film 8 are pierced by photolithography and etching. Then a source electrode 10 and a drain electrode 11 are formed by embedding Al or Cu as an electrode material into the holes and the structure shown in FIG. 2E is completed.

Here, explanation on a method for forming protrusions having a configuration different from the protrusions 50 and 60 having the protrusions 51 and 61 shown in FIG. 2E is omitted since it can be realized by using conventional photolithography and etching.

Third Exemplary Embodiment

Figure 7A:
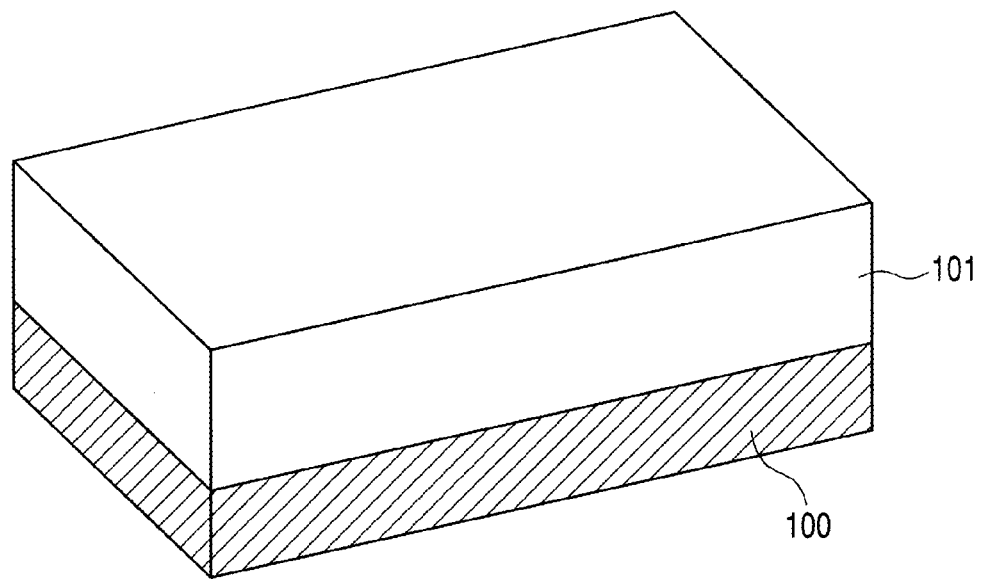
FIG. 7A is a perspective view (1) showing an example of an FET according to a third exemplary embodiment of a semiconductor device of the present invention.
Figure 7B:
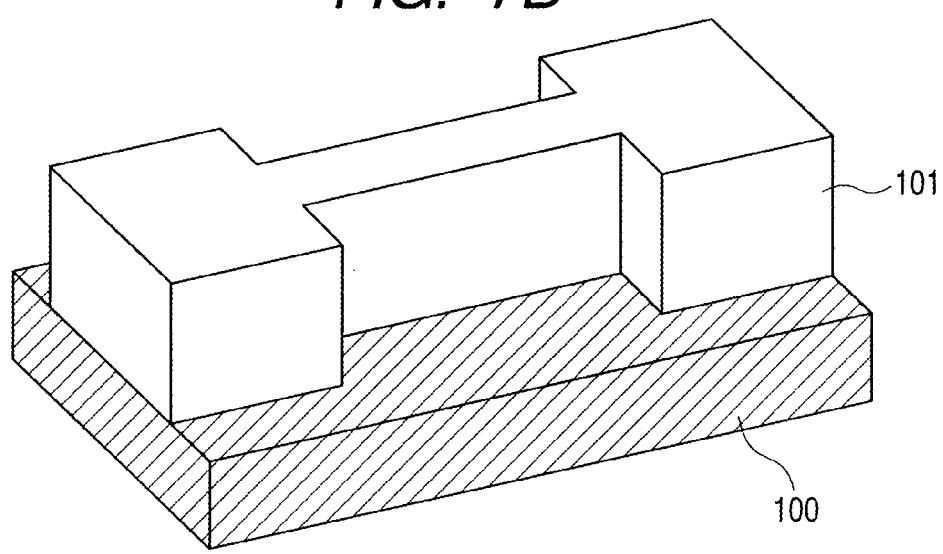
FIG. 7B is a perspective view (2) showing an example of an FET according to the third exemplary embodiment of a semiconductor device of the present invention.
Figure 7C:
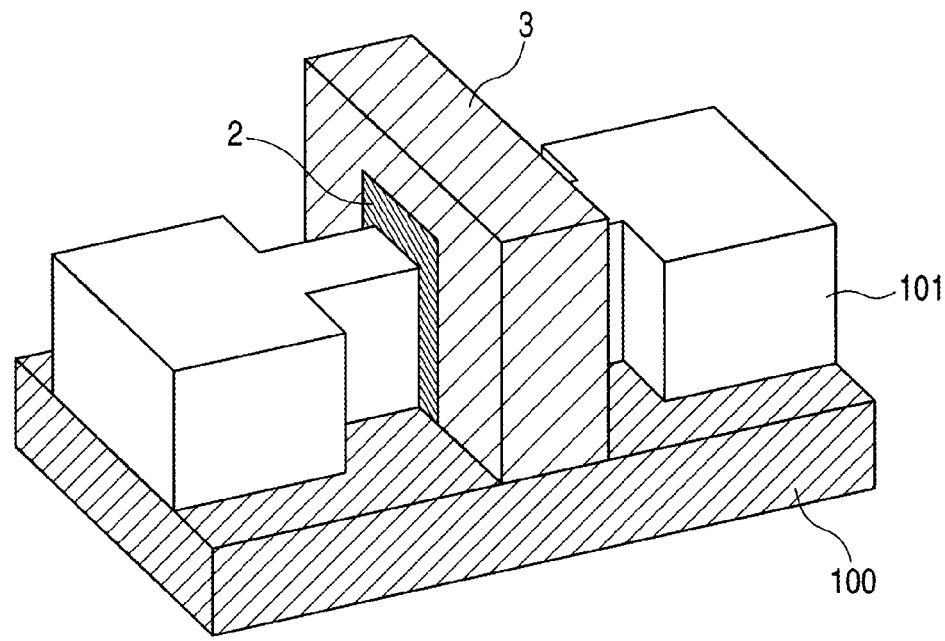
FIG. 7C is a perspective view (3) showing an example of an FET according to the third exemplary embodiment of a semiconductor device of the present invention.
Figure 7D:
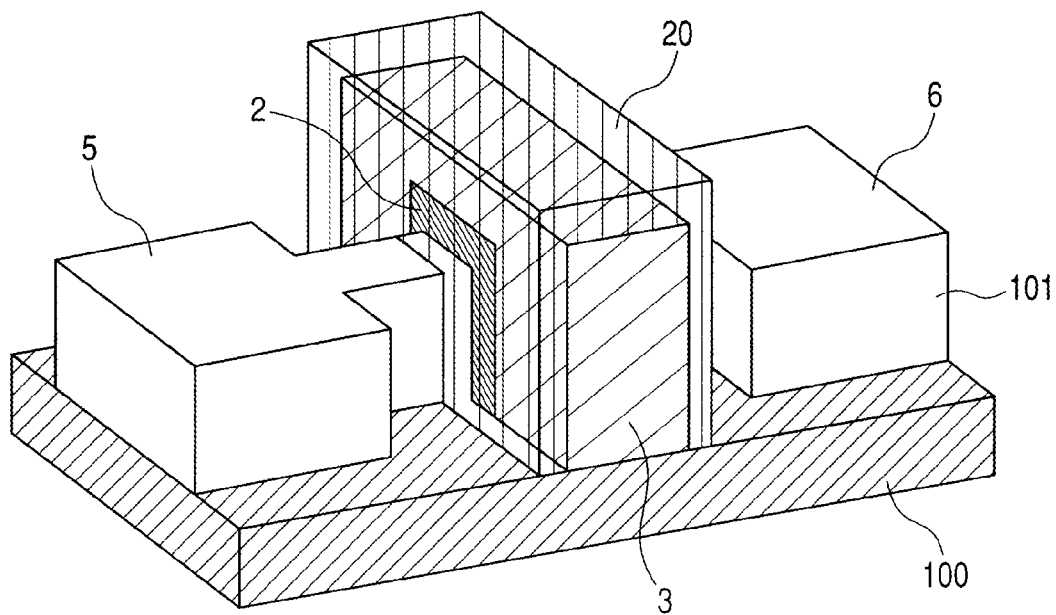
FIG. 7D is a perspective view (4) showing an example of an FET according to the third exemplary embodiment of a semiconductor device of the present invention.
Figure 7E:
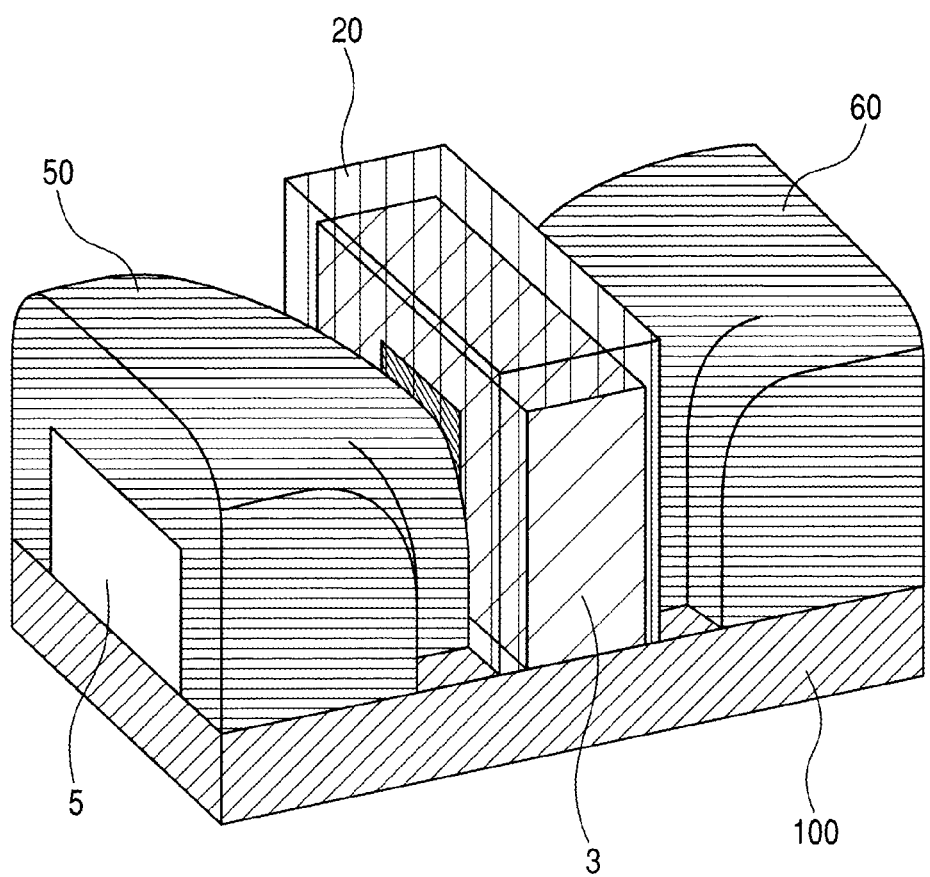
FIG. 7E is a perspective view (5) showing an example of an FET according to the third exemplary embodiment of a semiconductor device of the present invention.
Figure 7F:
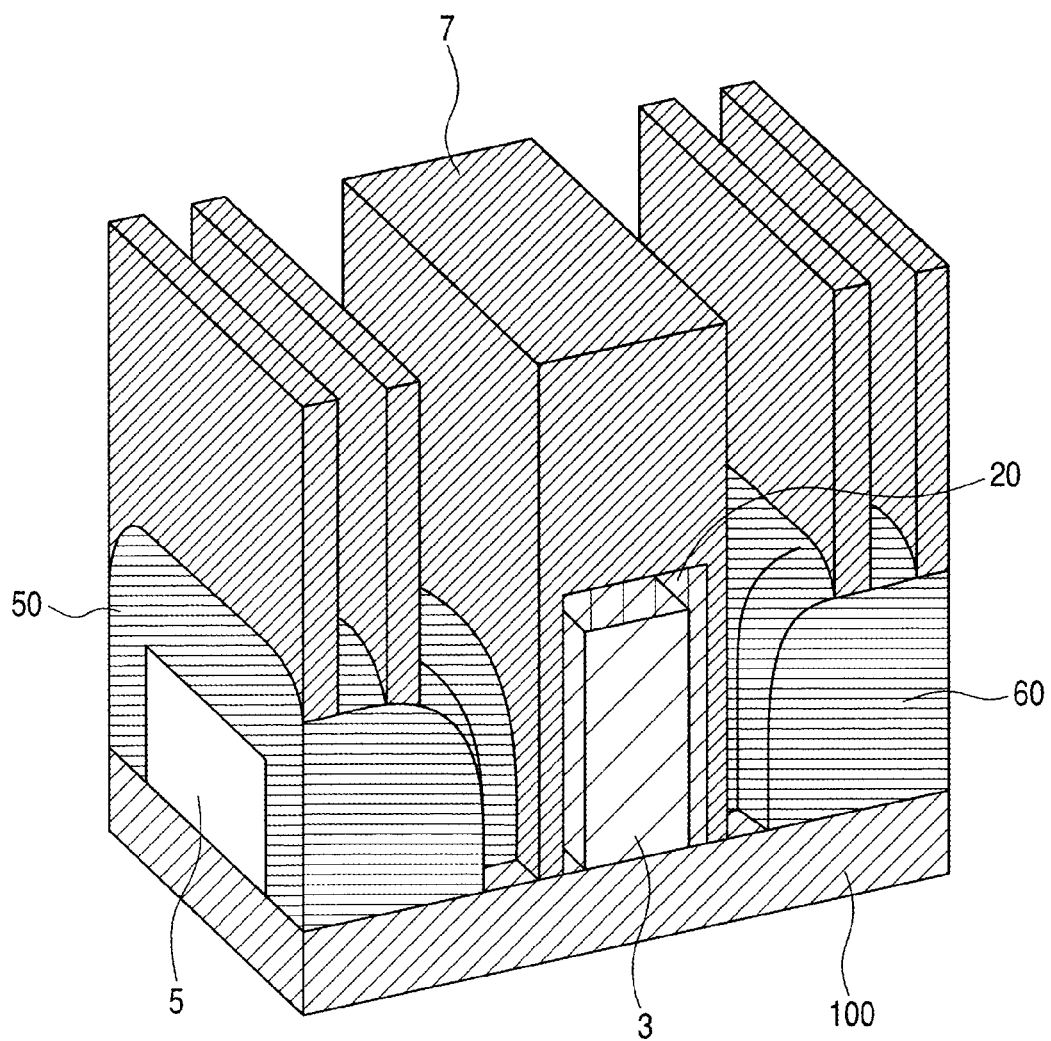
FIG. 7F is a perspective view (6) showing an example of an FET according to the third exemplary embodiment of a semiconductor device of the present invention.
Figure 7G:
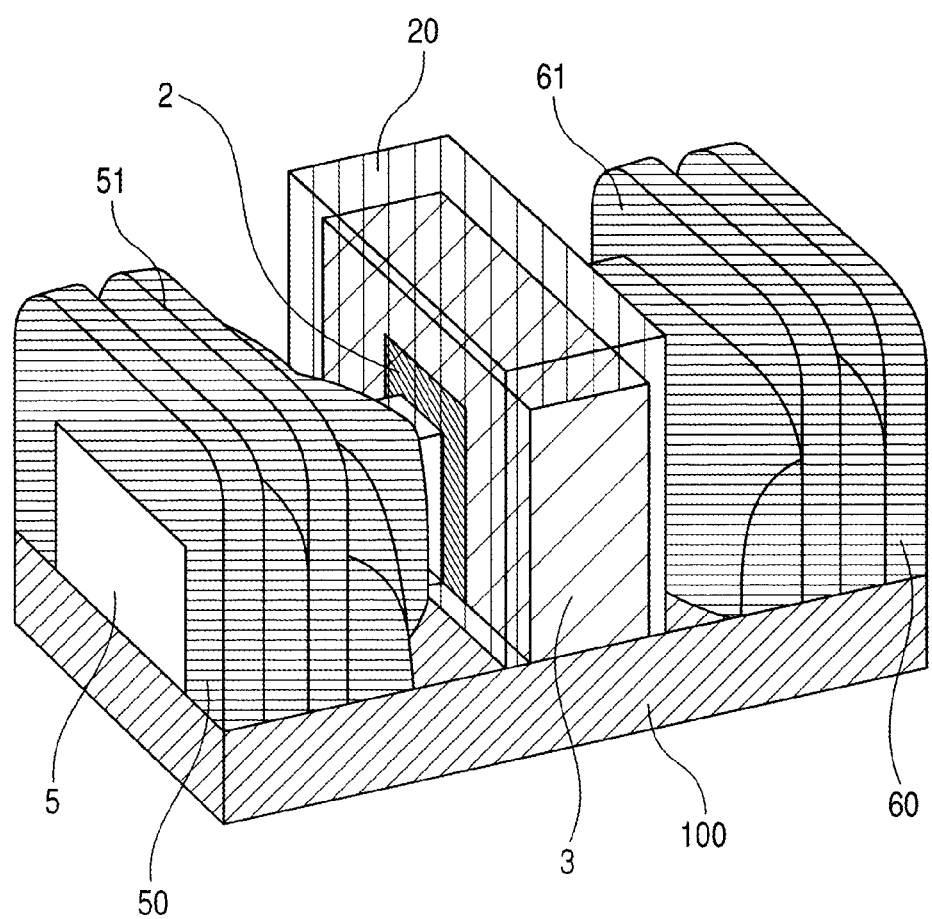
FIG. 7G is a perspective view (7) showing an example of an FET according to the third exemplary embodiment of a semiconductor device of the present invention.
Figure 7H:
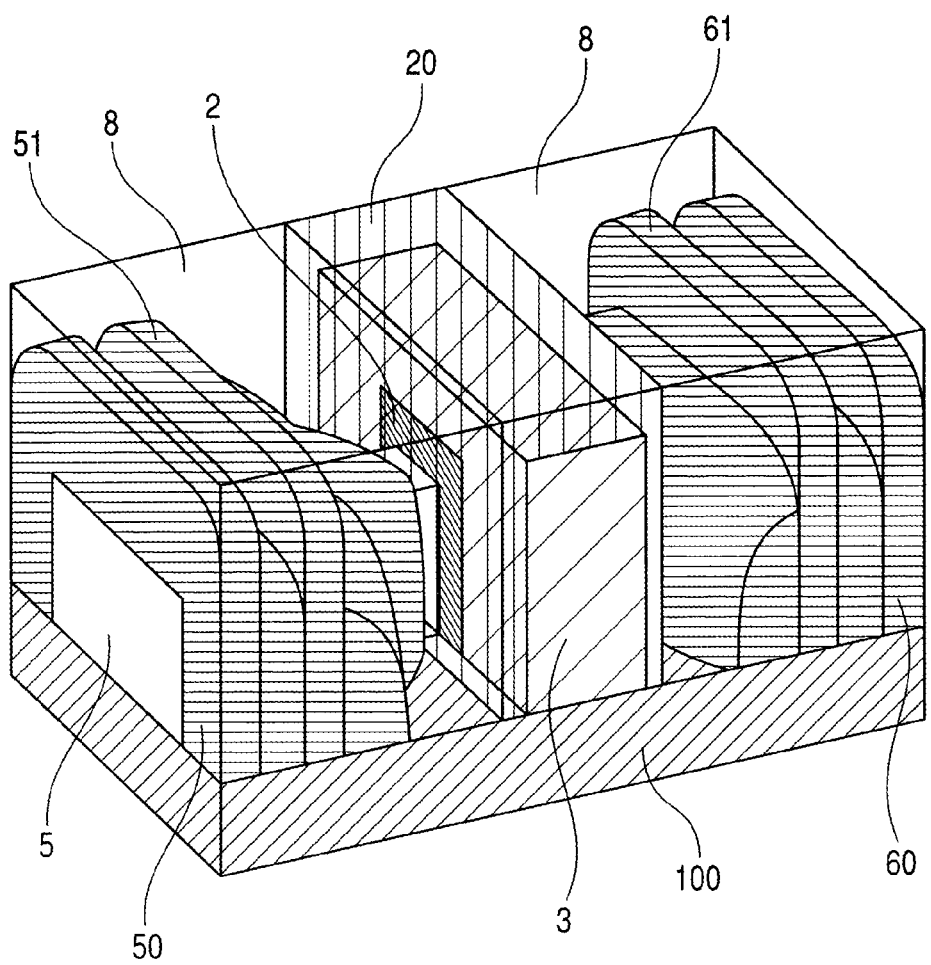
FIG. 7H is a perspective view (8) showing an example of an FET according to the third exemplary embodiment of a semiconductor device of the present invention.
Figure 7I:
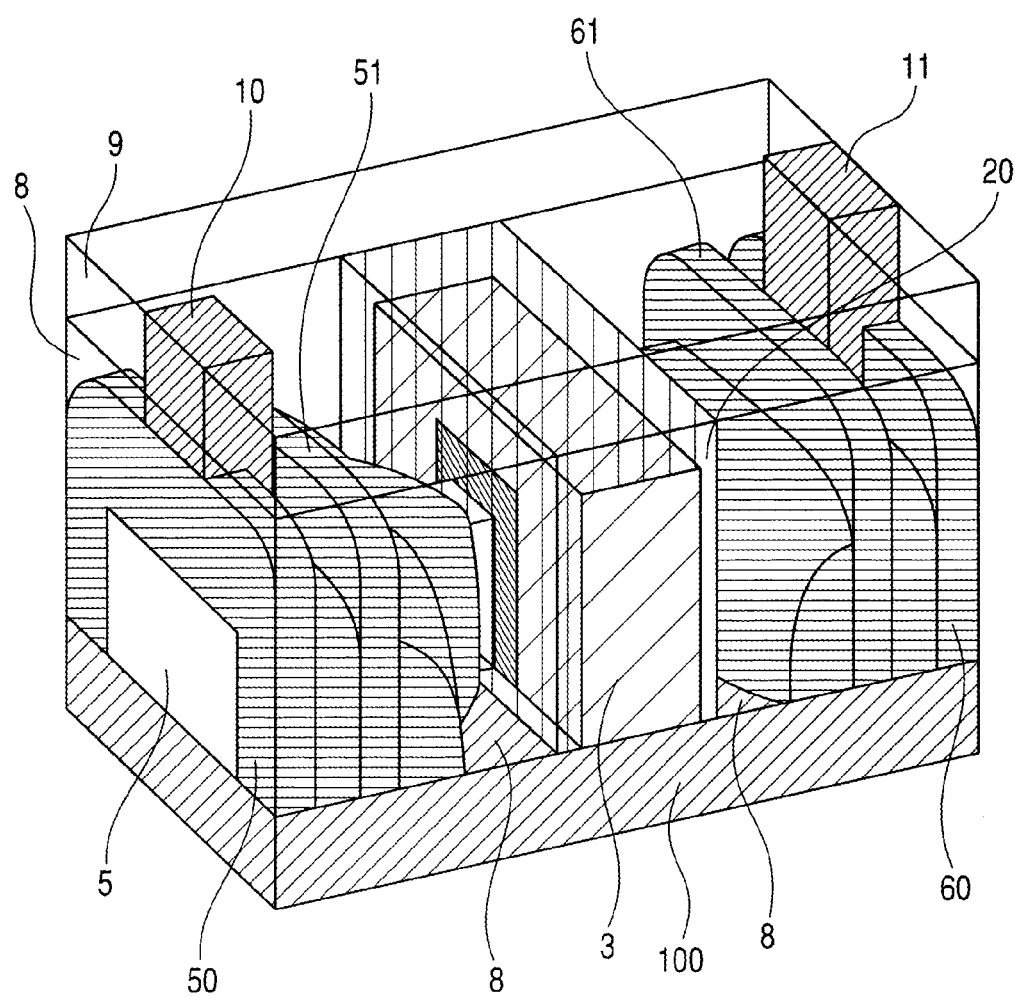
FIG. 7I is a perspective view (9) showing an example of an FET according to the third exemplary embodiment of a semiconductor device of the present invention.

A perspective view of an example of a semiconductor device according to the present embodiment is shown in FIG. 7I. A part of FIG. 7I is shown as a transmissive view. Further, a perspective view of an example of a semiconductor device according to the present embodiment in the middle of the process of producing the semiconductor device shown in FIG. 7I is shown in FIG. 7C.

A semiconductor device according to the present embodiment is based on a semiconductor device according to the second exemplary embodiment but, as shown in FIG. 7C, is different from the second exemplary embodiment in the points that a first plane of the semiconductor substrate has a convex shape comprising a device layer 101 and a gate insulating film 2 is formed continuously over the upper plane and the side plane of the convex shape comprising the device layer 101.

In the case of such a semiconductor device according to the present embodiment as described above, in the same way as the second exemplary embodiment, with the structure shown in FIG. 7I, it is possible to: hook a stress applying film 8 on protrusions 50 and 60 having protrusions 51 and 61 and recesses; and apply a strong stress to an extension region in a source/drain region directly and mechanically. On this occasion, since the protrusions 51 and 61 and the recesses can be formed over not only the upper plane of a source/drain diffusion layer region 5, 6 but also the side planes thereof and hence it comes to be possible to apply a stronger stress to a channel region than in the case of a flat-type FET explained in the first exemplary embodiment and the second exemplary embodiment.

Further, since the protrusions 51 and 61 and the recesses are further formed over the surfaces of the protrusions 50 and 60, it is possible to further increase the contact area with the stress applying film 8 and further inhibit the stress applying film 8 from peeling off.

Moreover, since the protrusions 51 and 61 and the recesses are further formed over the surfaces of the protrusions 50 and 60, secondary effects of increasing the contact area with the source electrode 10 or the drain electrode 11 and reducing contact resistance are exhibited.

A method for producing such a semiconductor device according to the present embodiment as described above is explained hereunder.

An example of a method for producing a semiconductor device according to the present embodiment is hereunder explained in detail in reference to FIGS. 7A to 7I. FIGS. 7A to 7I are perspective views showing an example of the structure of a semiconductor device according to the present embodiment in the sequence of the processes.

FIG. 7A shows an SOI substrate used as a semiconductor substrate. The SOI substrate uses silicon oxide as an embedded insulating film 100. In FIG. 7A, a Si layer is used as a device layer 101 over the embedded insulating film 100 but a Ge layer or a SiGe layer may also be used. Meanwhile, an embedded insulating film 100 is not necessarily required of a semiconductor substrate and a mere bulk semiconductor substrate may also be used. Moreover, strain Si over a SiGe layer or strain SiGe over a Si layer may be used as a device region layer.

Firstly, a protective film of a silicon nitride layer or a silicon oxide layer is patterned over the device layer 101 over the embedded insulating film 100 shown in FIG. 7A by photolithography and the device layer 101 is processed as shown in FIG. 7B by reactive ion etching. That is, a protrusion comprising the device layer 101 is formed over the embedded insulating film 100. After the processing, the used protective film is removed. The protective film may be removed with phosphoric acid in the case of a silicon nitride film and with hydrofluoric acid in the case of a silicon oxide film. Although the device layer 101 is processed into the shape of a dumbbell here, it may be processed into a mere rectangular parallelepiped shape.

Successively, a silicon oxide layer is formed as a gate insulating film 2 so as to continuously cover parts of the upper plane and the side plane of the device layer 101. Then a structure shown in FIG. 7C is obtained by forming a polysilicon layer as a gate electrode 3 in the same way and etching. The gate insulating film 2 may not be removed by etching on this occasion.

Thereafter, as shown in FIG. 7D, a silicon oxide layer is processed likewise as a gate protective film 20 to cover the gate insulating film 2 and the gate electrode 3. Here, the gate protective film 20 includes a gate sidewall insulating film. The gate protective film 20 may be formed into the shape shown in FIG. 7D by once depositing silicon oxide over the whole surface and then applying etching.

Thereafter, ions are implanted into a source and drain region and a source/drain diffusion layer region 5, 6 is formed. In the ion implantation, As or P is used in the case of an n-type and B or In is used in the case of a p-type, and a typical dose amount may be about $1 \times 10^{15}$ pieces per 1 $cm^2$.

Successively, a structure shown in FIG. 7E is obtained by selectively epitaxially growing a Si layer with a CVD apparatus and forming protrusions 50 and 60. Here, as the material for the protrusions 50 and 60, the same material as used for the source/drain diffusion layer region 5, 6 can be used as it has been explained in the first exemplary embodiment. Otherwise, it is also possible to, before protrusions 50 and 60 are formed, dig down the source and drain regions shown in FIG. 7D and form the protrusions 50 and 60 in the same way as explained in the first exemplary embodiment. On this occasion, the material for the protrusions 50 and 60 is the same as explained in the first exemplary embodiment. Here, the protrusions 50 and 60 may be formed either over the side plane or over both the upper plane and the side plane of the source/drain diffusion layer region 5, 6.

Successively, a pattern of a photoresist 7 is formed as shown in FIG. 7F by applying, exposing, and developing the photoresist over the surfaces of the protrusions 50 and 60 and the gate protective film 20. Then a structure shown in FIG. 7G is formed by peeling off the photoresist 7 with an ashing device and forming protrusions 51 and 61 and recesses over the surfaces of the protrusions 50 and 60 after the protrusions 50 and 60 are partially etched by reactive ion etching. Although it is omitted in FIG. 7G, it is also possible to form the protrusions 51 and 61 and the recesses over the side planes of the protrusions 50 and 60. Although the protrusions 51 and 61 and the recesses are configured so as to form grooves in a direction perpendicular to the source/drain direction in the present embodiment, another structure such as a structure of lattice-shaped grooves or a structure having plural isolated holes may be acceptable.

Thereafter, ions are implanted into the protrusions 50 and 60 having the structure shown in FIG. 7G and the protrusions 50 and 60 come to be a part of a source/drain diffusion layer region. Here, before a diffusion layer is formed, it is possible to control the diffusion layer region by increasing the thicknesses of the sidewall portions of the gate protective film 20 on the side of the source/drain diffusion layer region 5, 6 by a method similar to the method used for forming the gate protective film 20. On this occasion, the gate protective film 20 may take a laminated structure comprising silicon oxide and silicon nitride. In the ion implantation, As or P is used in the case of an n-type and B or In is used in the case of a p-type, and a typical dose amount may be about $1 \times 10^{15}$ pieces per 1 $cm^2$. After the implantation, the implanted ion species are activated by applying annealing at about 1,000° C.

Successively, as shown in FIG. 7H, a stress applying film 8 is formed. The stress applying film 8 over the upper part of the gate electrode is flattened by CMP and removed. The stress applying film 8 is formed typically with silicon nitride by using a CVD apparatus. The silicon nitride film can be formed by using $SiH_2Cl_2$ and $NH_3$ for example and a thermal expansion coefficient can be controlled by changing a mixing ratio on that occasion and a pressure at film forming. A stress applying film 8 that has a higher thermal expansion coefficient than Si of the substrate has and contracts more than Si of the substrate during cooling after the film forming is desirable in the case of an n-type FET. In contrast, a stress applying film 8 that contracts less than Si is desirable in the case of a p-type FET.

Thereafter, a silicon oxide film for example is formed as an interlayer insulating film 9 over the stress applying film 8 and the gate protective film 20 and contact holes of source and drain electrodes passing through the interlayer insulating film 9 and the stress applying film 8 are pierced by photolithography and etching. Then a source electrode 10 and a drain electrode 11 are formed by embedding Al or Cu as the electrode material into the holes and the structure shown in FIG. 7I is completed.

Fourth Exemplary Embodiment

Figure 8A:
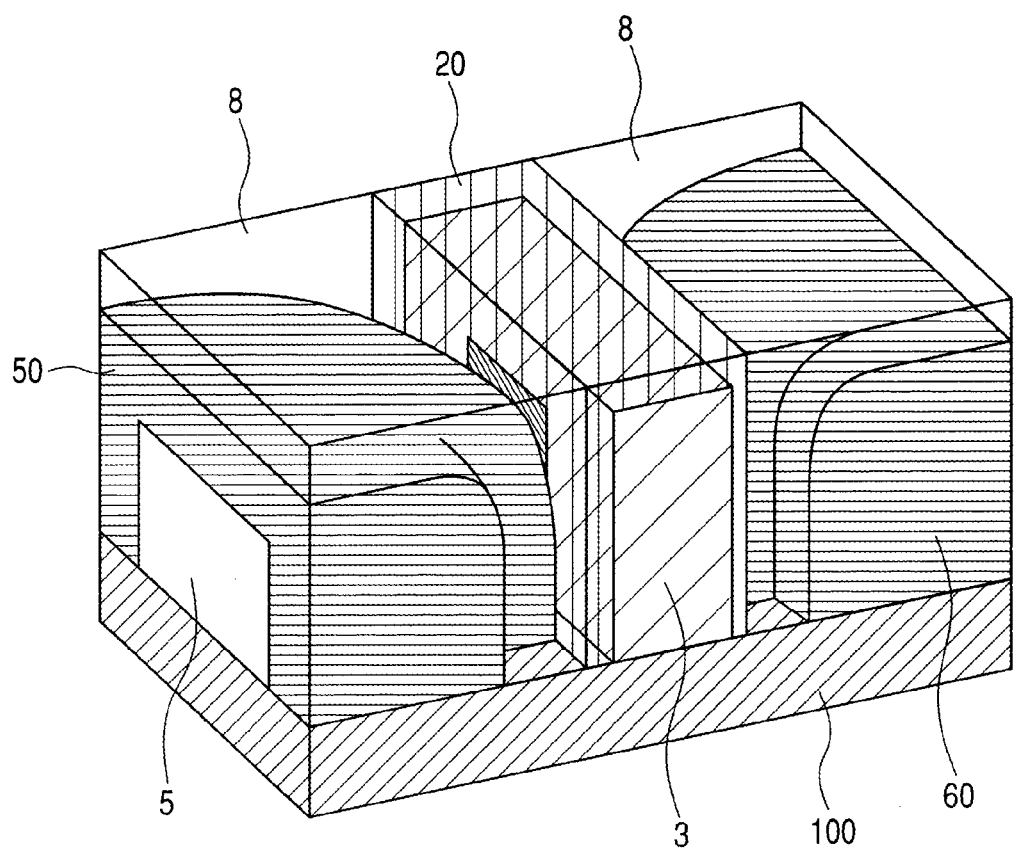
FIG. 8A is a perspective view (1) showing an example of an FET according to a fourth exemplary embodiment of a semiconductor device of the present invention.
Figure 8B:
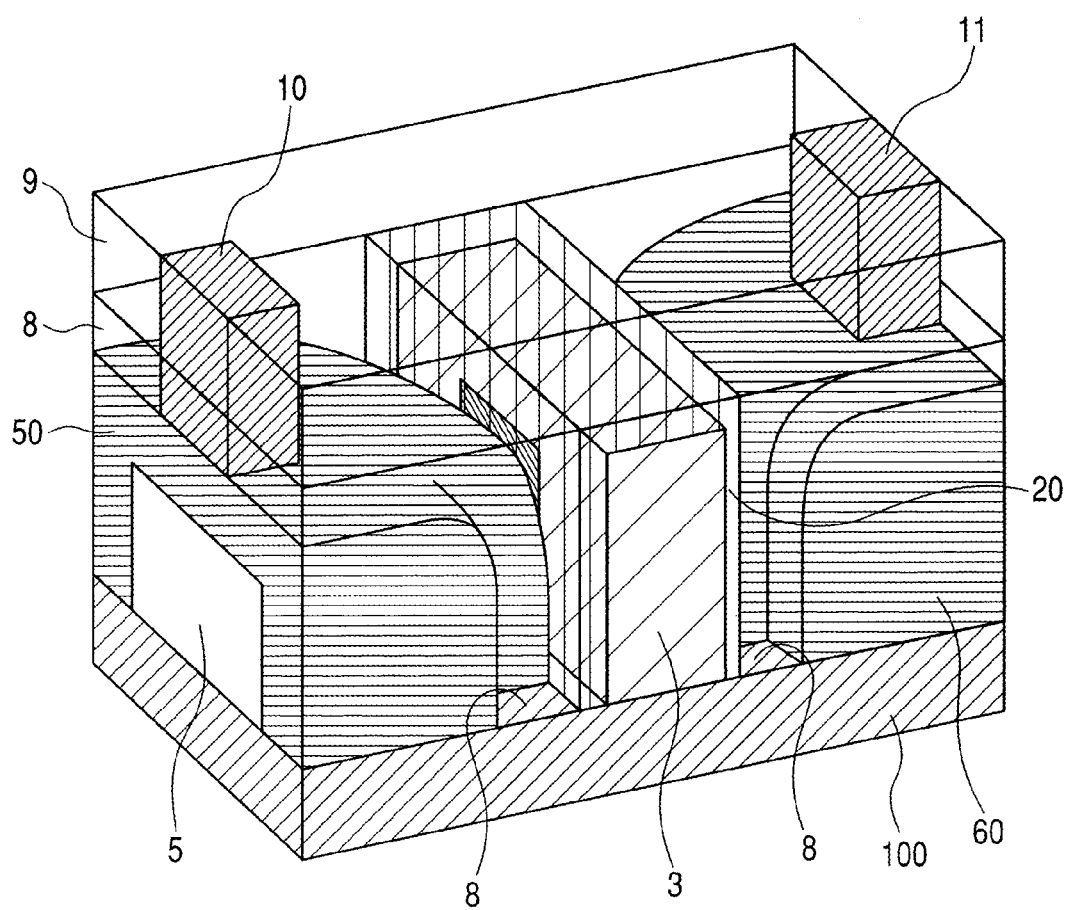
FIG. 8B is a perspective view (2) showing an example of an FET according to the fourth exemplary embodiment of a semiconductor device of the present invention.

A perspective view of an example of a semiconductor device according to the present embodiment is shown in FIG. 8B. A part of FIG. 8B is shown as a transmissive view. The present embodiment is based on the third exemplary embodiment but is different in the point that protrusions 50 and 60 do not have protrusions 51 and 61 on the surfaces in the present embodiment.

In the case of such a semiconductor device according to the present embodiment, in the same way as the third exemplary embodiment, it is possible to hook a stress applying film 8 on protrusions 50 and 60 and apply a strong stress to the extension region of a source/drain region directly and mechanically. Further, since the protrusions 50 and 60 can be formed over not only the upper planes but also the side planes of a source region 5 and a drain region 6, it is possible to apply a stronger stress to a channel region than in the case of a flat-type FET explained in the first exemplary embodiment and the second exemplary embodiment. Furthermore, unlike the third exemplary embodiment, it is possible to save time and effort required for forming a convex and concave structure over the surfaces of the protrusions 50 and 60.

A method for producing such a semiconductor device according to the present embodiment as stated above is explained hereunder.

A method for producing a semiconductor device according to the present embodiment is based on a method for producing a semiconductor device according to the third exemplary embodiment but is different in the processes after the structure shown in FIG. 7E is obtained.

An example of a method for producing a semiconductor device according to the present embodiment is hereunder explained in detail in reference to FIGS. 8A and 8B. FIGS. 8A and 8B are sectional views showing an example of the structure of a semiconductor device according to the present embodiment in the sequence of the processes after the structure shown in FIG. 7E is obtained. Here, the processes employed until the structure shown in FIG. 7E is obtained are the same as those employed in the third exemplary embodiment and hence the explanations thereof are omitted here.

After the structure shown in FIG. 7E is obtained, ions are implanted into the protrusions 50 and 60 and a part of a source/drain diffusion layer region is obtained. Thereafter, a stress applying film 8 is formed in the same way as the third exemplary embodiment, the stress applying film 8 over a gate protective film 20 is removed by CMP, and thus the structure shown in FIG. 8A is obtained.

Successively, a silicon oxide film for example is formed as an interlayer insulating film 9 over the stress applying film 8 and the gate protective film 20 and contact holes of source and drain electrodes passing through the interlayer insulating film 9 and the stress applying film 8 are pierced by photolithography and etching. Then a source electrode 10 and a drain electrode 11 are formed by embedding Al or Cu as the electrode material into the holes and the structure shown in FIG. 8B is completed.

Although the present invention has heretofore been explained in accordance with examples, the present invention is not limited only to the configurations in the examples and it goes without saying that various transformations and modifications that can be attained by persons skilled in the art are included in the scope of the present invention.

What is claimed is:

1. A semiconductor device comprising:
   a first horizontal layer comprised of a semiconductor substrate, a channel region formed therein, and a source/drain diffusion layer region provided adjacent to the channel region and having impurities implanted therein;
   a second horizontal layer, formed on top of the first horizontal layer, the second horizontal layer comprised of a gate insulating film formed over a top of the semiconductor substrate and a gate electrode formed over the gate insulating film,
   the gate electrode having opposite-facing sidewalls running in a direction away from the top of the semiconductor substrate to a top of the gate electrode;
   gate sidewall insulating films respectively formed adjacent to the sidewalls of the gate electrode in the second horizontal layer;
   a plurality of protrusion portions that protrude from the source/drain diffusion layer region into the second horizontal layer, each protrusion portion having a curved side surface that faces toward a side portion of a respective gate sidewall insulating film, an interstice formed between each gate sidewall insulating film and a respective side surface of the protrusion portions; and
   a stress applying film formed over the source/drain diffusion layer region except over an upper part of the gate electrode, the stress applying film filling the interstices between the protrusion portions and the gate sidewall insulating films,
   wherein the plurality of protrusion portions comprise bottom portions in the second horizontal layer and a plurality of top extending parts that extend vertically from the bottom portions,
   the top extending parts being vertically aligned with each other and spaced from one another, and each spaced from one another by an interstice.

2. The semiconductor device according to claim 1, wherein the plurality of protrusions are formed such that interstices are not provided directly between the source/drain diffusion layer region and the gate sidewall insulating films.

3. The semiconductor device according to claim 1, wherein respective bottom portions of the protrusion portions are adjacent to bottom portions of the gate sidewall insulating films such that the interstices do not directly contact the source/drain diffusion layer region.

4. The semiconductor device according to claim 1, wherein the plurality of protrusion portions comprises a material having a stronger adhesiveness with the semiconductor substrate than that of the stress applying film.

5. The semiconductor device according to claim 1, wherein the curved side surfaces of the protrusion portions curve downward from respective top portions of the protrusion portions to respective bottoms of the gate sidewall insulating films.

6. The semiconductor device according to claim 1, wherein the interstices formed by the curved side surfaces of the protrusion portions and the respective gate sidewall insulating films each have a V-shape.

* * * * *